US009252013B2

(12) United States Patent
Coe-Sullivan et al.

(10) Patent No.: US 9,252,013 B2
(45) Date of Patent: Feb. 2, 2016

(54) METHODS AND ARTICLES INCLUDING NANOMATERIAL

(75) Inventors: Seth Coe-Sullivan, Redondo Beach, CA (US); Maria J. Anc, Groveland, MA (US); LeeAnn Kim, Dover, MA (US); Vladimir Bulovic, Lexington, MA (US); Ioannis Kymissis, New York, NY (US); John E. Ritter, Westford, MA (US); Robert F. Praino, Jr., Westwood, MA (US)

(73) Assignee: QD VISION, INC., Lexington, MA (US)

( * ) Notice: Subject to any disclaimer, the term of this patent is extended or adjusted under 35 U.S.C. 154(b) by 1220 days.

(21) Appl. No.: 12/287,142

(22) Filed: Oct. 6, 2008

(65) Prior Publication Data

US 2009/0208753 A1  Aug. 20, 2009

Related U.S. Application Data

(63) Continuation of application No. PCT/US2007/008705, filed on Apr. 9, 2007.

(60) Provisional application No. 60/790,393, filed on Apr. 7, 2006, provisional application No. 60/792,170, filed on Apr. 14, 2006, provisional application No. 60/792,086, filed on Apr. 14, 2006.

(51) Int. Cl.
| | |
|---|---|
| *B32B 9/04* | (2006.01) |
| *H01L 21/02* | (2006.01) |
| *B82Y 20/00* | (2011.01) |
| *B82Y 30/00* | (2011.01) |
| *B82Y 40/00* | (2011.01) |
| *C01B 31/02* | (2006.01) |
| *H01L 51/50* | (2006.01) |
| *H01L 21/027* | (2006.01) |
| *H01L 51/56* | (2006.01) |

(52) U.S. Cl.
CPC ........... *H01L 21/02628* (2013.01); *B82Y 20/00* (2013.01); *B82Y 30/00* (2013.01); *B82Y 40/00* (2013.01); *C01B 31/0206* (2013.01); *H01L 21/0271* (2013.01); *H01L 21/02521* (2013.01); *H01L 21/02601* (2013.01); *H01L 21/02603* (2013.01); *H01L 21/02606* (2013.01); *H01L 51/5012* (2013.01); *B05D 2401/32* (2013.01); *H01L 21/02639* (2013.01); *H01L 51/56* (2013.01); *Y10T 428/31504* (2015.04)

(58) Field of Classification Search
CPC .................. H01L 21/02628; H01L 21/02521; H01L 21/02601; H01L 21/02603; H01L 21/02639; H01L 21/02606; H01L 21/0271; H01L 51/5012; H01L 51/56; Y10T 428/31504; B05D 2401/32; B82Y 20/00; B82Y 30/00; B82Y 40/00; C01B 31/0206

USPC .............. 428/402, 403, 407; 257/79, 103, 94; 977/773, 784
IPC ................ B32B 9/04; B05D 3/02; H01L 21/02
See application file for complete search history.

(56) References Cited

U.S. PATENT DOCUMENTS

| | | |
|---|---|---|
| 4,130,343 A | 12/1978 | Miller et al. |
| 4,235,958 A | 11/1980 | Barraud et al. |
| 4,652,464 A | 3/1987 | Ludlum et al. |
| 4,684,353 A | 8/1987 | deSouza |
| 4,791,881 A | 12/1988 | Iwasaki |
| 4,844,002 A | 7/1989 | Wenz |
| 4,948,635 A | 8/1990 | Iwasaki |
| D328,943 S | 8/1992 | Iwasaki et al. |
| 5,199,098 A | 3/1993 | Nolan et al. |
| 5,266,114 A | 11/1993 | Iwasaki |
| D346,397 S | 4/1994 | Iwasaki et al. |
| D355,669 S | 2/1995 | Iwasaki et al. |
| 5,537,000 A | 7/1996 | Alivisatos et al. |
| 5,599,897 A | 2/1997 | Nishiguchi et al. |
| 5,975,711 A | 11/1999 | Parker et al. |
| 6,251,303 B1 | 6/2001 | Bawendi et al. |
| 6,322,901 B1 | 11/2001 | Bawendi et al. |
| 6,501,091 B1 | 12/2002 | Bawendi et al. |
| 6,593,690 B1 | 7/2003 | McCormick et al. |
| 6,608,439 B1 | 8/2003 | Sokolik et al. |
| 6,613,247 B1 | 9/2003 | Hohn et al. |
| 6,639,733 B2 | 10/2003 | Minano et al. |
| 6,730,356 B2 | 5/2004 | Kim et al. |
| 6,732,643 B2 | 5/2004 | Kwon et al. |

(Continued)

FOREIGN PATENT DOCUMENTS

| | | |
|---|---|---|
| JP | 2002-216962 | 8/2002 |
| WO | WO 2001/066997 A2 | 9/2001 |

(Continued)

OTHER PUBLICATIONS

Adachi, C. et al., "High-efficiency red electrophosphorescence devices", *Appl. Phys. Lett.* 78, 1622 (2001).
Arango, A.C. "A Quantum Dot Heterojunction Photodetector", Thesis, Submitted to the Department of Electrical Engineering and Computer Science, at MIT, Feb. 2005.
Bulovic et al., "Molecular Organic Light-Emitting Devices" *Semiconductors and Semimetals* vol. 64, Ch. 5, pp. 255-302 (2000).
Coe-Sullivan, "Hybrid Organic/Quantum Dot Thin Film Structures and Devices", MIT Thesis in partial fulfillment of Ph.D. in Electrical Engineering and Computer Science (2005).
Coe-Sullivan, S. et al.,"Large-Area Ordered Quantum-Dot Monolayers via Phase Separation During Spin-Casting" *Adv.Funct. Mater.*, vol. 15, pp. 1117-1124 (2005).

(Continued)

*Primary Examiner* — Leszek Kiliman

(57) ABSTRACT

A method of depositing a nanomaterial onto a donor surface comprises applying a composition comprising nanomaterial to a donor surface. In another aspect of the invention there is provided a method of depositing a nanomaterial onto a substrate. Methods of making a device including nanomaterial are disclosed. An article of manufacture comprising nanomaterial disposed on a backing member is disclosed.

14 Claims, No Drawings

(56) References Cited

U.S. PATENT DOCUMENTS

| | | |
|---|---|---|
| 6,744,960 B2 | 6/2004 | Pelka |
| 6,776,094 B1 | 8/2004 | Whitesides et al. |
| 6,784,603 B2 | 8/2004 | Pelka et al. |
| 6,835,583 B2 | 12/2004 | Yi et al. |
| 6,860,199 B2 | 3/2005 | Lee et al. |
| 7,065,285 B2 | 6/2006 | Chen et al. |
| 7,115,216 B2 | 10/2006 | Carter et al. |
| 7,166,010 B2 | 1/2007 | Lamansky et al. |
| 7,253,452 B2* | 8/2007 | Steckel et al. ............. 257/103 |
| 7,265,037 B2* | 9/2007 | Yang et al. ............. 438/497 |
| 7,294,861 B2 | 11/2007 | Schardt et al. |
| 7,332,211 B1 | 2/2008 | Bulovic et al. |
| 7,381,516 B2 | 6/2008 | Arney et al. |
| 7,390,568 B2* | 6/2008 | Kim et al. ............. 428/403 |
| 7,545,051 B2* | 6/2009 | Yang et al. ............. 257/784 |
| 7,635,609 B2 | 12/2009 | Cok |
| 7,674,712 B2 | 3/2010 | Cok |
| 7,695,150 B2 | 4/2010 | Dejima et al. |
| 7,989,153 B2 | 8/2011 | Skipor et al. |
| 8,193,018 B2 | 6/2012 | Cok |
| 8,277,942 B2* | 10/2012 | Kim et al. ............. 428/403 |
| 8,353,613 B2 | 1/2013 | Choi et al. |
| 8,470,617 B2 | 6/2013 | Coe-Sullivan et al. |
| 8,618,561 B2 | 12/2013 | Coe-Sullivan et al. |
| 8,642,977 B2 | 2/2014 | Comerford et al. |
| 2002/0021003 A1 | 2/2002 | McGrew |
| 2002/0047560 A1 | 4/2002 | Lee et al. |
| 2002/0071952 A1 | 6/2002 | Bawendi et al. |
| 2002/0186921 A1 | 12/2002 | Schumacher et al. |
| 2002/0187347 A1 | 12/2002 | Halas et al. |
| 2003/0003300 A1 | 1/2003 | Korgel et al. |
| 2003/0035917 A1 | 2/2003 | Hyman |
| 2003/0041444 A1* | 3/2003 | Debe et al. ............. 29/623.1 |
| 2003/0047535 A1 | 3/2003 | Schueller et al. |
| 2003/0071794 A1 | 4/2003 | Arakawa et al. |
| 2003/0103123 A1 | 6/2003 | Snyder |
| 2003/0106488 A1 | 6/2003 | Huang et al. |
| 2003/0124260 A1 | 7/2003 | Baek |
| 2003/0152703 A1 | 8/2003 | Hammond et al. |
| 2003/0177941 A1 | 9/2003 | Barbera-Guillem |
| 2004/0012083 A1 | 1/2004 | Farrell et al. |
| 2004/0023010 A1 | 2/2004 | Bulovic et al. |
| 2004/0027062 A1 | 2/2004 | Shiang et al. |
| 2004/0027327 A1 | 2/2004 | LeCain et al. |
| 2004/0028875 A1 | 2/2004 | Van Rijn et al. |
| 2004/0036130 A1 | 2/2004 | Lee et al. |
| 2004/0091710 A1 | 5/2004 | Bawendi et al. |
| 2004/0110002 A1 | 6/2004 | Kim et al. |
| 2004/0118448 A1 | 6/2004 | Scher et al. |
| 2004/0166235 A1* | 8/2004 | Fujii et al. ............. 427/77 |
| 2004/0178338 A1 | 9/2004 | Empedocles et al. |
| 2004/0203170 A1 | 10/2004 | Barbera-Guillem |
| 2004/0206942 A1 | 10/2004 | Hsu |
| 2004/0227703 A1 | 11/2004 | Lamvik et al. |
| 2004/0245912 A1 | 12/2004 | Thurk et al. |
| 2004/0265492 A1 | 12/2004 | Free et al. |
| 2005/0035346 A1 | 2/2005 | Bazan et al. |
| 2005/0045269 A1 | 3/2005 | Tateishi |
| 2005/0048295 A1 | 3/2005 | Kim et al. |
| 2005/0051777 A1 | 3/2005 | Hill |
| 2005/0054004 A1 | 3/2005 | Alivisatos et al. |
| 2005/0058416 A1 | 3/2005 | Hoon Lee et al. |
| 2005/0062903 A1 | 3/2005 | Cok et al. |
| 2005/0066883 A1 | 3/2005 | Dubrow et al. |
| 2005/0069644 A1 | 3/2005 | Hsieh et al. |
| 2005/0072989 A1 | 4/2005 | Bawendi et al. |
| 2005/0095736 A1 | 5/2005 | Padiyath et al. |
| 2005/0098205 A1 | 5/2005 | Roscheisen et al. |
| 2005/0106415 A1 | 5/2005 | Jarikov et al. |
| 2005/0116621 A1 | 6/2005 | Bellmann et al. |
| 2005/0118403 A1 | 6/2005 | Anazawa et al. |
| 2005/0126628 A1 | 6/2005 | Scher et al. |
| 2005/0133087 A1 | 6/2005 | Alivisatos et al. |
| 2005/0135079 A1 | 6/2005 | Yin Chua et al. |
| 2005/0142343 A1 | 6/2005 | Winkler et al. |
| 2005/0147849 A1 | 7/2005 | Wolk |
| 2005/0157157 A1 | 7/2005 | Tsukamoto et al. |
| 2005/0163934 A1 | 7/2005 | Ruschak et al. |
| 2005/0164227 A1 | 7/2005 | Ogura et al. |
| 2005/0186405 A1 | 8/2005 | Jeong et al. |
| 2005/0191448 A1 | 9/2005 | Suh et al. |
| 2005/0218377 A1 | 10/2005 | Lawandy |
| 2005/0230356 A1 | 10/2005 | Empedocles et al. |
| 2005/0241573 A1 | 11/2005 | Ogawa et al. |
| 2005/0243233 A1 | 11/2005 | Kim |
| 2005/0245085 A1 | 11/2005 | Yoo |
| 2005/0249901 A1 | 11/2005 | Yializis et al. |
| 2005/0260274 A1 | 11/2005 | Chinea et al. |
| 2005/0265935 A1 | 12/2005 | Hollingsworth et al. |
| 2005/0274944 A1 | 12/2005 | Jang et al. |
| 2005/0287348 A1 | 12/2005 | Faler et al. |
| 2006/0002101 A1 | 1/2006 | Wheatley et al. |
| 2006/0003097 A1 | 1/2006 | Andres et al. |
| 2006/0012853 A1 | 1/2006 | Tallone et al. |
| 2006/0021533 A1 | 2/2006 | Jeans |
| 2006/0034065 A1 | 2/2006 | Thurk |
| 2006/0063351 A1 | 3/2006 | Jain |
| 2006/0068154 A1 | 3/2006 | Parce et al. |
| 2006/0103589 A1 | 5/2006 | Chua et al. |
| 2006/0132027 A1 | 6/2006 | Gao |
| 2006/0141245 A1 | 6/2006 | Stellacci et al. |
| 2006/0160209 A1 | 7/2006 | Larson et al. |
| 2006/0196375 A1 | 9/2006 | Coe-Sullivan et al. |
| 2006/0199313 A1 | 9/2006 | Harting et al. |
| 2006/0227546 A1 | 10/2006 | Yeo et al. |
| 2006/0240590 A1 | 10/2006 | Mountziaris et al. |
| 2007/0001581 A1 | 1/2007 | Stasiak et al. |
| 2007/0004065 A1 | 1/2007 | Schardt et al. |
| 2007/0013996 A1 | 1/2007 | Verma |
| 2007/0034833 A1 | 2/2007 | Parce et al. |
| 2007/0034844 A1 | 2/2007 | Holtzhausen |
| 2007/0045777 A1 | 3/2007 | Gillies et al. |
| 2007/0096078 A1 | 5/2007 | Lee et al. |
| 2007/0102694 A1 | 5/2007 | Drndic et al. |
| 2007/0103068 A1 | 5/2007 | Bawendi et al. |
| 2007/0119951 A1 | 5/2007 | Auslander et al. |
| 2007/0145350 A1 | 6/2007 | Kobori |
| 2007/0152177 A1 | 7/2007 | Nichols |
| 2008/0001167 A1 | 1/2008 | Coe-Sullivan et al. |
| 2008/0030126 A1 | 2/2008 | Scholz et al. |
| 2008/0121911 A1 | 5/2008 | Andrews et al. |
| 2008/0237540 A1 | 10/2008 | Dubrow |
| 2009/0017268 A1 | 1/2009 | Skipor et al. |
| 2009/0034057 A1 | 2/2009 | LeCain et al. |
| 2009/0039764 A1 | 2/2009 | Cho et al. |
| 2009/0087792 A1 | 4/2009 | Iizumi et al. |
| 2009/0116107 A1 | 5/2009 | Kindler et al. |
| 2009/0162011 A1 | 6/2009 | Coe-Sullivan et al. |
| 2009/0181478 A1 | 7/2009 | Cox et al. |
| 2009/0215208 A1 | 8/2009 | Coe-Sullivan et al. |
| 2009/0215209 A1 | 8/2009 | Anc et al. |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283743 A1 | 11/2009 | Coe-Sullivan et al. |
| 2009/0286338 A1 | 11/2009 | Coe-Sullivan et al. |
| 2010/0068468 A1 | 3/2010 | Coe-Sullivan et al. |
| 2010/0167011 A1 | 7/2010 | Dubrow |
| 2010/0208493 A1 | 8/2010 | Choi et al. |
| 2010/0265307 A1 | 10/2010 | Linton et al. |

FOREIGN PATENT DOCUMENTS

| | | |
|---|---|---|
| WO | WO 2005/067524 A2 | 7/2005 |
| WO | WO 2007/103310 A2 | 9/2007 |
| WO | WO 2007/103310 A3 | 9/2007 |
| WO | WO 2007/11768 A2 | 10/2007 |
| WO | WO2007117672 | 10/2007 |
| WO | WO2007117672 A3 | 10/2007 |
| WO | WO2007/143197 A2 | 12/2007 |
| WO | WO2008033388 A2 | 3/2008 |
| WO | WO2008033388 A3 | 3/2008 |

(56) References Cited

FOREIGN PATENT DOCUMENTS

| WO | WO2008111947 A1 | 9/2008 |
| WO | WO-2011047385 A1 | 4/2011 |

OTHER PUBLICATIONS

D'Andrade et al., "Bright White Electrophosphorescent Triple-Emissive Layer Organic Light Emitting Device" *MRS Fall Meeting*, BB6.2 (2001).

Dirr et al., "Organic Light-Emitting Diodes with Reduced Spectral and Spacial Halfwidths" *Jpn. J. Appl. Phys.* vol. 37, 1457-1461 (1998).

Grieser, et al., "Size-quantised semiconductor cadmium chalcogenide particles in Langmuir-Blodgett films", *J. Chem. Soc., Faraday Trans.*, 1992, 88, pp. 2207-2214.

Kirstein, S. et al., "Herringbone Structures in Two-Dimensional Single Crystals of Cyanine Dyes. I. Detailed Structure Analysis Using Electron Diffraction", J. Chem. Phys. 103(2) Jul. 1995, pp. 816.

Kirstein, S. et al., "Herringbone Structures in Two-Dimensional Single Crystals of Cyanine Dyes. II. Optical Properties", J. Chem. Phys. 103(2) Jul. 1995, pp. 826.

Kumar, A. et al., "Features of gold having micrometer to centimeter dimensions can be formed through a combination of stamping with an elastomeric stamp and an Alkanethiol 'ink' followed by chemical etching" *Appl. Phys. Lett.*, vol. 63, pp. 2002-2004, (1993).

Mishra, A. et al. "Cyanines During the 1990s: A Review", Chem. Rev. 2000, vol. 100, pp. 1973-2011.

PCT International Search Report and Written Opinion in International Application No. PCT/US2007/008705 of QD Vision, Inc., mailed Apr. 3, 2008.

Peyratout, C. et al., Aggregation of Thiacyanine Derivatives on Polyelectrolytes:, *Phys. Chem. Chem. Phys.*, 2002, 4, 3032-3039.

Picard, G. "A universal nano coater" *2006 NSTI Nanotechnology Conference and Trade Show—Nanotech 2006—9$^{th}$ Annual.*

Santhanam, V. et al., "Microcontact Printing of Uniform Nanoparticle Arrays" *Nano Letters*, vol. 4, pp. 41-44, (2004).

Schlamp, M.C. et al., "Improved efficiencies in light emitting diodes made with CdSe(CdS) core/shell type nanocrystals and a semiconducting polymer" 1997 American Institute of Physics, *J. Appl. Phys.* vol. 82 (11), 1997, pp. 5837-5842.

Yamasaki et al., "Organic Light-emitting device with an ordered monolayer of silica microspheres as a scattering medium" *Appl. Phys. Lett.*, vol. 76, No. 10, pp. 1243-1245 (2000).

Yasui Seiki Co., (USA), "The Yasui Seiki 'Microgravure™' Coating Method", Copyright 2001-2005, Yasui Seiki Co., (USA), (both pdf version and website version).

\* cited by examiner

US 9,252,013 B2

METHODS AND ARTICLES INCLUDING NANOMATERIAL

This application is a continuation of commonly owned PCT Application No. PCT/US2007/008705 filed 9 Apr. 2007, which was published in the English language as PCT Publication No. WO 2007/117668 on 18 Oct. 2007. The PCT Application claims priority from commonly owned U.S. Application Nos. 60/790,393 filed 7 Apr. 2006; 60/792,170 filed 14 Apr. 2006; and 60/792,086 filed 14 Apr. 2006. The disclosures of each of these applications are hereby incorporated herein by reference in their entireties.

TECHNICAL FIELD OF THE INVENTION

The invention relates to articles and methods including deposition of material. More particularly, the invention relates to articles including nanomaterial and methods including deposition of nanomaterials.

BACKGROUND OF THE INVENTION

A number of industries, e.g., electronics, displays, lighting, optoelectronics, and energy industries, rely on the formation of layers, coatings and/or patterns of materials on substrates in the fabrication of a variety of products, product components, product accessories, etc.

SUMMARY OF THE INVENTION

It has been recognized that it would be advantageous to develop improved articles of manufacture including nanomaterial, methods for depositing nanomaterials onto a substrate, and methods for making a device including nanomaterial.

In one aspect of the invention there is provided a method of depositing nanomaterial onto a donor surface. In a detailed aspect, the method comprises applying a composition comprising nanomaterial and liquid to a donor surface and removing liquid from the composition disposed on the donor surface.

In another aspect of the invention there is provided a method of depositing a nanomaterial onto a substrate. The method comprises applying a composition comprising nanomaterial to a donor surface, and depositing at least a portion of the composition disposed on the donor surface onto the substrate.

In another aspect of the invention there is provided a method of depositing nanomaterial onto a substrate. The method comprises applying a composition comprising nanomaterial and liquid to a donor surface, and depositing at least a portion of the composition onto the substrate.

In another aspect of the invention there is provided a method of depositing nanomaterial onto a substrate. The method comprises applying a composition comprising nanomaterial and liquid to a donor surface, and removing liquid from the composition disposed on the donor surface before depositing at least a portion of the substantially liquid-free composition onto the substrate.

In another aspect of the invention there is provided a method of depositing nanomaterial onto a substrate. The method comprises applying a composition comprising nanomaterial to a donor surface, transferring at least a portion of the composition disposed on the donor surface to a transfer surface, and depositing at least a portion of the composition disposed on the transfer surface onto the substrate.

In another aspect of the invention there is provided a method of depositing nanomaterial onto a substrate. The method comprises applying a composition comprising nanomaterial and liquid to a donor surface; removing liquid from the composition disposed on the donor surface before transferring at least a portion of the substantially liquid-free composition to a transfer surface; and depositing at least a portion of the substantially liquid-free composition disposed on the transfer surface onto the substrate.

In another aspect of the invention there is provided a method of depositing nanomaterial onto a substrate. The method comprises applying a composition comprising nanomaterial and liquid to a donor surface; transferring at least a portion of the composition disposed on the donor surface to a transfer surface; and removing liquid from the composition disposed on the transfer surface before depositing at least a portion of the substantially liquid-free composition from the transfer surface onto the substrate.

In another aspect of the invention there is provided a method for depositing nanomaterial to a substrate. The method comprises: providing a substrate; providing a film including a layer comprising nanomaterial disposed on a side thereof, contacting the layer comprising nanomaterial to the substrate. In a detailed aspect, the method can optionally further include removing the film from the layer of nanomaterial deposited on the substrate. In a detailed aspect, the layer is contacted to the substrate under conditions to cause the layer comprising nanomaterial to deposit onto the substrate. In a detailed aspect, the method can optionally further include removing the film from the layer of nanomaterial deposited on the surface.

In another aspect of the invention there is provided a method for depositing nanomaterial to a substrate. The method comprises: providing a substrate; providing a film including a layer comprising nanomaterial disposed on a side thereof, contacting the layer comprising nanomaterial to a transfer surface under conditions to cause the layer comprising nanomaterial to deposit on the transfer surface; removing at least a portion of the nanomaterial disposed on the transfer surface, and depositing nanomaterial onto the substrate. In a detailed aspect, the method can optionally further include removing the film from the layer of nanomaterial deposited on the transfer surface.

In one aspect of the invention there is provided an article of manufacture comprising nanomaterial disposed on a backing member. In certain embodiments, the backing member comprises a film.

In another aspect of the invention there is provided an article of manufacture comprising nanomaterial reversibly attached to a backing member. In certain embodiments, the backing member comprises a film.

In another aspect of the invention there is provided an article of manufacture comprising nanomaterial disposed on a removable backing member. In certain embodiments, the backing member comprises a film.

In another aspect of the invention there is provided a method of depositing a layer comprising nanomaterial onto a donor surface. The method comprises applying a layer including a composition comprising nanomaterial to a donor surface. In a detailed aspect of the method, the donor surface includes a surface treatment such that the nanomaterial is reversibly attached to the donor surface. In another detailed aspect of the invention, the donor surface comprises a film.

In another aspect of the invention there is provided a method for making a device. The method comprises: providing a substrate; providing a film including a layer comprising nanomaterial disposed on a side thereof, contacting the layer comprising nanomaterial to a surface of the substrate. In a detailed aspect, the layer comprising nanomaterial is contacted to the surface of the substrate under conditions to cause the layer comprising nanomaterial to deposit on the substrate. In a detailed aspect, the method can optionally further include removing the film from the layer of nanomaterial deposited on the surface.

In certain embodiments of the methods and articles of the invention, a donor surface comprises a sheet, film, tape, web material, etc. that is larger than the substrate or predetermined area of the substrate onto which nanomaterial is to be deposited. The sheet, film, tape, web material, etc. can be divided into one or more separate pieces of predetermined size prior to being contacted to the substrate. In certain embodiments the predetermined size of the separate pieces corresponds to the size of the substrate onto which nanomaterial is to be deposited. In certain embodiments the size of the separate pieces corresponds to the size of the a predetermined area of the substrate onto which nanomaterial is to be deposited.

Other aspects of the invention include systems for depositing nanomaterial, articles including deposited nanomaterial, and related methods.

The foregoing, and other aspects described herein all constitute embodiments of the present invention.

It is to be understood that both the foregoing general description and the following detailed description are exemplary and explanatory only and are not restrictive of the present invention. Other embodiments will be apparent to those skilled in the art from consideration of the specification and practice of the invention disclosed herein.

DETAILED DESCRIPTION OF THE INVENTION

One aspect of the invention relates to methods for depositing nanomaterial onto a substrate.

The nanomaterial can optionally be included in a composition. The composition can further include liquid or other carrier medium. The composition can further include one or more additional components. In certain embodiments, a composition includes a sol-gel, such as a metal oxide sol-gel.

A nanomaterial typically includes nanoparticles having an average maximum dimension smaller than 100 nm.

Examples of nanoparticles include, for example, a semiconductor nanocrystal, a nanotube (such as a single walled or multi-walled carbon nanotube), a nanowire, a nanorod, a dendrimer, organic nanocrystal, organic small molecule, or other nano-scale or micro-scale material, or mixtures thereof.

Nanomaterial particles can have various shapes, including, but not limited to, sphere, rod, disk, other shapes, and mixtures of various shaped particles.

Examples of organic nanocrystals include, without limitation, J-aggregates, H-aggregates, and organic nanocrystals including aggregates with other dipole arrangements. Examples of organic nanocrystals are described in S. Kirstein et al., "Herringbone Structures In Two-Dimensional Single Crystals of Cyanine Dyes. I. Detailed Structure Analysis Using Electron Diffraction", J. Chem. Phys. 103(2) July 1995, pages 816 et seq.; S. Kirstein et al., "Herringbone Structures In Two-Dimensional Single Crystals of Cyanine Dyes. II. Optical Properties", J. Chem. Phys. 103(2) July 1995, pages 826 et seq.; A. Mishra et al. "Cyanines During the 1990s: A Review", Chem. Rev. 2000, 100, 1973-2011; and C. Peyratout et al., "Aggregation of Thiacyanine Derivatives On Polyelectrolytes: Phys. Chem. Chem. Phys., 2002, 4, 3032-3039, the disclosures of which are hereby incorporated herein by reference in their entireties.

A nanomaterial can include one nanomaterial or a mixture of two or more different nanomaterials. Nanomaterials can be different based on, e.g. chemical composition, physical characteristics, (e.g., particle morphology, size, shape, surface area, particle size distribution, Full Width at Half-Maximum (FWHM), etc.), surface treatment(s) (e.g., not surface-modified, surface modified, and if surface modified, the details of the surface modification (e.g., composition, etc.)), particle structure (e.g., uncoated or coated; and if coated, the details of the coating, e.g., composition, thickness, nature of the coating (e.g., continuous, non-continuous, particulate, film, etc.)), performance characteristics (e.g., absorption properties, emission characteristics, etc.) of each nanomaterial, different combinations of chemical, physical, and/or performance aspects, etc.

In certain embodiments, nanomaterial includes semiconductor nanocrystals. Semiconductor nanocrystals comprise nanometer-scale inorganic semiconductor particles. Semiconductor nanocrystals preferably have an average nanocrystal diameter less than about 150 Angstroms (Å), and most preferably in the range of 12-150 Å.

In certain embodiments, semiconductor nanocrystals comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, alloys and/or mixtures thereof, including ternary and quaternary alloys thereof, and/or mixtures. Examples include, but are not limited to, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, Si, Ge, alloys thereof, and/or mixtures thereof, including ternary and quaternary alloys and/or mixtures.

In certain embodiments, semiconductor nanocrystals preferably include a "core" of one or more first semiconductor materials, which may be surrounded by an overcoating or "shell" of a second semiconductor material. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary alloys and/or mixtures. Other non-limiting examples are provided above. Examples of materials suitable for use as semiconductor nanocrystal shells include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary alloys and/or mixtures. Other non-limiting examples are provided above.

In certain embodiments, the surrounding "shell" material can have a bandgap greater than the bandgap of the core material. In certain embodiments, the shell can be chosen so as to have an atomic spacing close to that of the "core" substrate. In certain embodiments, the surrounding shell material can have a bandgap less than the bandgap of the core material. In a further embodiment, the shell and core materials can have the same crystal structure. Examples of semiconductor nanocrystals (core)shell structures include, without limitation: (CdSe)ZnS (core)shell, (CdZnSe)CdZnS (core)shell, and (CdS)CdZnS (core)shell.

For further examples of core/shell semiconductor structures, see U.S. application Ser. No. 10/638,546, entitled "Semiconductor Nanocrystal Heterostructures", filed 12 Aug. 2003, which is hereby incorporated herein by reference in its entirety.

The semiconductor nanocrystals are preferably members of a population of semiconductor nanocrystals having a narrow size distribution. More preferably, the semiconductor nanocrystals comprise a monodisperse or substantially monodisperse population of semiconductor nanocrystals. The monodisperse distribution of diameters can also be referred to as a size. In certain embodiments, the monodisperse population of semiconductor nanocrystals exhibits less than a 15% rms deviation in diameter of the nanocrystals, preferably less than 10%, more preferably less than 5%.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. Additional examples of methods of preparing semiconductor nanocrystal are described in U.S. patent application Ser. No. 11/354,185 of Bawendi et al., entitled "Light Emitting Devices Including Semiconductor Nanocrystals", filed 15 Feb. 2006, and U.S. patent application Ser. No. 11/253,595 of Coe-Sullivan et al., entitled "Light Emitting Device Including Semiconductor Nanocrystals", filed 21 Oct. 2005, and U.S. patent application Ser. No. 10/638,546 of Kim et al., entitled "Semiconductor Nanocrystal Heterostructures", filed 12 Aug. 2003, referred to above, each of which is hereby incorporated by reference herein in its entirety.

One method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl)phosphide ($(TMS)_3P$), tris(trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used. In certain embodiments, a non-coordinating solvent can be used.

Size distribution during the growth stage of the reaction can be estimated by monitoring the absorption line widths of the particles. Modification of, e.g., the reaction temperature, injection rates, concentrations) in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, other shape, or mixtures of various shaped particles.

As discussed above, in certain embodiments, a semiconductor nanocrystal can include a core/shell structure. In such embodiments, a semiconductor nanocrystal can include a core of a semiconductor material. A semiconductor nanocrystal core can comprise, for example, and without limitation, a semiconductor material represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Other examples are provided elsewhere herein.

In embodiments including a core/shell structure, the core includes a shell (also referred to as an overcoating) on a surface of the core. The overcoating can be a semiconductor material having a composition different from the composition of the core The overcoating of a semiconductor material on a surface of the nanocrystal core can include, for example, and without limitation, Group IV elements, Group II-VI compounds, Group II-V compounds, Group III-VI compounds, Group III-V compounds, Group IV-VI compounds, Group I-III-V compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, Ge, Si, alloys thereof and/or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. In certain embodiments, the overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

In certain embodiments, semiconductor nanocrystals are optionally surface modified, including, but not limited to, for example, having one or more ligand groups attached thereto.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites, which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. Nanocrystal outer layers are described in U.S. Pat. No. 6,251,303, which is incorporated by reference in its entirety.

More specifically, the coordinating ligand can have the formula:

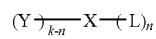

wherein k is 2, 3 or 5, and n is 1, 2, 3, 4 or 5 such that k-n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond. The hydrocarbon chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—, —P($R^a$)—, or —P(O)($R^a$)—. Each of $R^a$ and $R^b$, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, Advanced Organic Chemistry, which is incorporated herein by reference in its entirety. See also U.S. patent application Ser. No. 10/641,292 entitled "Stabilized Semiconductor Nanocrystals", filed 15 Aug. 2003, which is hereby incorporated herein by reference in its entirety. See also the patent applications, which include descriptions of preparation methods that are listed above.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis is absorption spectrum.

As discussed above, certain embodiments of a composition can include nanomaterial and a carrier medium (e.g., liquid, polymer, monomer, polymer or monomer solution, etc.). The carrier medium is preferably liquid in which the nanomaterial does not does not appreciably dissolve, and preferably, not dissolve.

Examples of liquid for inclusion in a composition including nanomaterial (e.g., without limitation, semiconductor nanocrystals) include, without limitation, those listed in the following Table 1, and mixtures of two or more thereof. Examples of mixtures include hexane and octane, etc.

TABLE 1

| Liquid | Formula | Viscosity @25° C. | Boiling Point @1 atm | Relative Polarity (compared to water) |
| --- | --- | --- | --- | --- |
| cyclohexane | $C_6H_{12}$ | 0.89 | 80.7 | 0.006 |
| pentane | $C_5H_{12}$ | 0.24 | 36.1 | 0.009 |
| hexane | $C_6H_{14}$ | 0.30 | 69 | 0.009 |
| heptane | $C_7H_{16}$ | 0.91 | 98 | 0.012 |

TABLE 1-continued

| Liquid | Formula | Viscosity @25° C. | Boiling Point @1 atm | Relative Polarity (compared to water) |
|---|---|---|---|---|
| carbon tetrachloride | $CCl_4$ | 0.91 | 76.7 | 0.052 |
| p-xylene | $C_8H_{10}$ | 0.63 | 138.3 | 0.074 |
| toluene | $C_7H_8$ | 0.56 | 110.6 | 0.099 |
| benzene | $C_6H_6$ | 0.60 | 80.1 | 0.111 |
| diethyl ether | $C_4H_{10}O$ | 0.22 | 34.6 | 0.117 |
| methyl t-butyl alcohol | $C_5H_{12}O$ | | 55.2 | 0.148 |
| dioxane | $C_4H_8O_2$ | 1.21 | 101.1 | 0.164 |
| tetrahydrofurane (THF) | $C_4H_8O$ | 0.47 | 66 | 0.207 |
| ethyl acetate | $C_4H_8O_2$ | | 77 | 0.228 |
| dimethoxy-ethane (glyme) | $C_4H_{10}O_2$ | | 85 | 0.231 |
| diglyme | $C_6H_{14}O_3$ | | 162 | 0.244 |
| chloroform | $CHCl_3$ | 0.54 | 61.2 | 0.259 |
| methylene chloride | $CH_2Cl_2$ | 0.43 | 39.8 | 0.309 |
| 2-butanone | $C_4H_8O$ | | 79.6 | 0.327 |
| acetone | $C_3H_6O$ | 0.31 | 56.2 | 0.355 |
| t-butyl alcohol | $C_4H_{10}O$ | | 82.2 | 0.389 |
| dimethyl-formamide (DMF) | $C_3H_7NO$ | | 153 | 0.404 |
| dimethyl sulfoxide (DMSO) | $C_2H_6OS$ | | 189 | 0.444 |
| acetonitrile | $C_2H_3N$ | 0.35 | 81.6 | 0.46 |
| 2-propanol | $C_3H_8O$ | 2.40 | 82.4 | 0.546 |
| 1-butanol | $C_4H_{10}O$ | 3.00 | 117.6 | 0.602 |
| 1-propanol | $C_3H_8O$ | 1.95 | 97 | 0.617 |
| acetic acid | $C_2H_4O_2$ | | 118 | 0.648 |
| ethanol | $C_2H_6O$ | 1.20 | 78.5 | 0.654 |
| diethylene glycol | $C_4H_{10}O_3$ | 35.70 | 245 | 0.713 |
| methanol | $CH_4O$ | 0.59 | 64.6 | 0.762 |
| ethylene glycol | $C_2H_6O_2$ | 16.90 | 197 | 0.79 |
| glycerin | $C_3H_8O_3$ | 1410.00 | 290 | 0.812 |
| water, heavy (D2O) | $D_2O$ | | 101.3 | 0.991 |
| water | $H_2O$ | 1.00 | 100 | 1 |
| Nonane | $(CH_3(CH_2)_7CH_3)$ | 0.67 | 39.0 | |
| Decane | $C_{10}H_{22}$ | 0.84 | 174.1 | |
| Dodecane | $C_{12}H_{26}$ | 1.25 | 216.2 | |
| Chlorobenzene | $C_6H_5Cl$ | 0.75 | 132 | |
| Dichlorobenzene | $C_6H_4Cl_2$ | — | 174.0 | |
| Anisole | $C_7H_8O$ | 0.92 | 154.0 | |
| Dimethyl formamide | $HCON(CH_3)_2$ | 0.79 | 149.56 | |
| 1-Methyl-2-pyrrolidinone | | 1.7 | 204.5 | |
| Carbon tetrachloride | $CCl_4$ | 0.91 | 76.8 | |
| 1,1,1-Trichloroethane | $CH_3CCl_3$ | 0.73 | 74.0 | |
| Tetrachloroethylene | $ClCH=CCl_2$ | 0.57 | 87.0 | |
| Ethylbenzene | $C_8H_{10}$ | 0.67 | 136.0 | |

Other liquids or mixtures of liquids can be used. In certain embodiments, volatile liquids or mixtures of volatile liquids can be used.

In certain embodiments, a composition including nanomaterial and liquid (a composition including a nanomaterial and liquid also referred to herein as an ink) has a viscosity in a range of from about 0.1 centipoise (e.g., that of diethyl ether, methanol) to greater than 1500 centipoise (e.g., that of oils, glycerol).

In embodiments including nanomaterial comprising semiconductor nanocrystals, a preferred liquid comprises an organic non-polar solvent. In certain embodiments, the carrier has a viscosity less than or equal to about 1 cP. In certain embodiments, the carrier is selected to have relatively high volatility if carrier removal is desired.

Optionally, other components can be included in the composition. Examples of other components that can be optionally included in the composition include, but are not limited to, e.g., surfactants, solvents, co-solvents, buffers, biocides, viscosity modifiers, complexing agents, chelating agents, stabilizing agents (e.g., to inhibit agglomeration of the nanomaterial). etc. Stabilizing agents can include, e.g., chemically attached functional groups or ligands to form a coating around individual nanoparticles.

The amount (e.g., concentration (wt/vol)) of nanomaterial included in a composition can be selected based upon the particular nanomaterial and desired attributes of the deposited nanomaterial (e.g., thickness, optical density, features of the deposited nanomaterial (e.g., patterned or unpatterned, sizes of the features of a pattern, etc.). The amount can be readily determined by a person of ordinary skill in the art.

For example, in certain embodiments of compositions including semiconductor nanocrystals and a liquid (including, e.g., but not limited to, a liquid comprising non-polar organic solvent or solvent mixture), the composition includes at least about 0.1 mg/ml semiconductor nanocrystals. In examples of other embodiments, the composition can include at least 1 mg/ml, at least 5 mg/ml, at least 10 mg/ml, at least 25 mg/ml; at least 50 mg/ml, etc.

In certain preferred embodiments, the nanomaterial and any other optional solid components are colloidally dispersed in the composition when introduced onto the transfer surface.

Methods in accordance with the invention allow deposition of one or more nanomaterials. The nanomaterial can be deposited as a layer that can be patterned or unpatterned.

Methods in accordance with the invention are particularly useful for applying one or more nanomaterials to a predefined region of a donor surface, transfer surface, and/or substrate, which substrate may optionally include other materials, layers, components, and/or structures disposed thereon.

The predefined region is a region on the substrate where the nanomaterial is selectively applied. The nanomaterial and surface can be chosen such that the nanomaterial remains substantially entirely within the predetermined area. Nonmaterial can be applied to the donor surface such that the nanomaterial forms an unpatterned layer of nanomaterial within the predetermined area or a pattern of nanomaterial within the predetermined area. The pattern can be a regular pattern (such as an array, or a series of lines), or an irregular pattern.

Once one or more nanomaterials are applied to the surface, the surface can have a region including the nanomaterial (the predefined region) and a region substantially free of nanomaterial. In some circumstances, the one or more nanomaterials are deposited onto on the substrate at a thickness of about a monolayer. In some circumstances, the thickness can be greater than a monolayer. The predefined region can be a discontinuous region. In other words, when the one or more nanomaterials are applied to the predefined region of the substrate, locations including nanomaterial can be separated by other locations that are substantially free of nanomaterial.

See, for example, A. Kumar and G. Whitesides, Applied Physics Letters, 63, 2002-2004, (1993); and V. Santhanam and R. P. Andres, Nano Letters, 4, 41-44, (2004), each of which is incorporated by reference in its entirety. See also U.S. patent application Ser. No. 11/253,612, filed 21 Oct. 2005, entitled "Method And System For Transferring A Patterned Material", of Co-Sullivan et al. and U.S. patent application Ser. No. 11/253,595, filed 21 Oct. 2005, entitled "Light Emitting Device Including Semiconductor Nanocrystals," of Coe-Sullivan, each of which is incorporated herein by reference in its entirety.

When deposited in a patterned arrangement, nanomaterial can be deposited in a pattern comprising features having at least one dimension at a micron-scale (e.g., less than 1 mm, less than 500 µm, less than 200 µm, less than 100 µm or less, less than 50 µm or less, less than 20 µm or less, or less than 10 µm or less). Nanomaterial can also be deposited in a patterned arrangement comprising features at greater than micron-scale.

A pattern of deposited nanomaterial having features on the micron scale may also be referred to herein as a micropattern.

For example, a micropattern including 10-20 µm size features is sufficiently small for most light emitting device applications including, e.g., semiconductor nanocrystals.

The surface on which the nanomaterial can be deposited can have dimensions of 1 cm or greater, 10 cm or greater, 100 cm or greater, or 1,000 cm or greater, up to 40 inches or greater.

Methods in accordance with the invention are scalable and can be useful in depositing a pattern of one or more nanomaterials over a wide range of surface areas.

For example, the method is useful for depositing nanomaterial over very small areas (for example, 100 µm catheters) to very large areas, (for example, 12" square areas). In further example, the method is also useful for depositing nanomaterial over surfaces with dimensions such as GEN2 (360 mm×465 mm), GEN3 (550 mm×650 mm), GEN3.5 (600 mm×720 mm), GEN4 (730 mm×920 mm), GEN5 (1110 mm×1250 mm), GEN6 (1500 mm×1800 mm), GEN7 (1900 mm×2100 mm), and subsequent generations of glass that can be used, e.g., in displays. Optionally, areas onto which nanomaterial is applied can then be stitched (or tiled) together, to expand the printable area from 12" squares, to 'n×12" squares' as is frequently done in the semiconductor lithography field.

In one aspect of the invention there is provided a method of depositing nanomaterial onto a donor surface. The method comprises applying a composition comprising nanomaterial and liquid to a donor surface and removing liquid from the composition disposed on the donor surface. Preferably all or substantially all of the liquid is removed from the composition.

In another aspect of the invention there is provided a method of depositing a nanomaterial onto a substrate. The method comprises applying a composition comprising nanomaterial to a donor surface, and depositing at least a portion of the composition disposed on the donor surface onto the substrate.

In another aspect of the invention there is provided a method of depositing nanomaterial onto a substrate. The method comprises applying a composition comprising nanomaterial and liquid to a donor surface, and depositing at least a portion of the composition onto the substrate.

In another aspect of the invention there is provided a method of depositing nanomaterial onto a substrate. The method comprises applying a composition comprising nanomaterial and liquid to a donor surface, and removing liquid from the composition disposed on the donor surface before depositing at least a portion of the substantially liquid-free composition onto the substrate. Preferably all or substantially all of the liquid is removed from the composition.

In another aspect of the invention, a predetermined pattern of nanomaterial can be formed on a substrate by positioning a mask including one or more apertures arranged in a desired predetermined pattern on the substrate prior to contacting nanomaterial disposed on a donor surface onto the substrate. By contacting the surface of the donor surface including nanomaterial onto the substrate through mask apertures, a pattern of the nanomaterial can be applied to the substrate. In certain embodiments, nanomaterial on the donor surface is preferably dry (e.g., at least substantially free of liquid) prior contacting surface of the donor surface including nanomaterial to the substrate through mask apertures. In certain embodiments, nanomaterial may be deposited through less than all of the apertures. In certain embodiments, nanomaterial on the donor surface preferably comprises an unpatterned layer. In certain embodiments involving printing of nanomaterial comprising semiconductor nanocrystals, the deposition (also referred to herein as printing) step(s) are preferably carried out in a nitrogen or vacuum environment In one embodiment, a composition including nanomaterial and a liquid is applied to a donor surface. Preferably the donor surface is dried to remove substantially all, and more preferably all, of the liquid included in composition disposed thereon. A mask including a predetermined pattern of apertures of a desired size and shape is inserted between the substrate and the donor surface and aligned to the substrate. The donor surface including dried nanomaterial is brought into contact with the substrate through the apertures at a predetermined pressure following which the donor surface is released from the substrate (e.g., by releasing the pressure, translating the substrate, etc.). In embodiments including deposition of one or more additional nanomaterials and/or compositions to the same substrate, the substrate can optionally be translated to a next location for a subsequent deposition step or alternatively, for example, the first mask can be cleaned and repositioned over the substrate for re-use or a different mask can be positioned over and aligned to the substrate and the next nanomaterial and/or composition deposited.

The foregoing process is particularly useful for depositing semiconductor nanocrystal emissive materials in a process for making various electro-optical devices including but not limited to electroluminescent light-emitting devices and displays.

In certain embodiments, a mask can be fabricated from a class of films comprising polyimides including fluorinated polyimide films or film coated, at least on one side, with a fluorinated material. In certain embodiment, a film coated, on at least one side, with a coating comprising an aromatic material. In certain embodiments, one side of the film can be coated with a fluorinated material and the other side can be coated with an aromatic material.

In certain embodiments in which a side of the mask is positioned on the substrate, it is preferred to use a fluorinated polyimide film or film coated, at least on one side, with a fluorinated material, with the side of the film including the fluorinated material being positioned against the substrate.

In certain embodiment, if a mask comprises plastic and/or a plastic coating, it is preferably baked out at elevated temperature with vacuum to remove VOCs, etc. prior to printing.

Masks of different thickness can be used. By way of non-limiting example, a mask comprising a polyimide film having a thickness of 1 mil polyimide can be used. Thinner and/or thicker masks are also suitable. Masks thinner than 0.5 mil are desirable for printing higher resolution patterns. Masks with a thickness less than 0.5 mil may require tensioning. Alternatively, the rigidity and/or dimensional stability of masks with a thickness less than 0.5 mil can be enforce with a thin steel foil. In certain other embodiments, a mask can comprise a rigid foil which optionally can be coated on one or both sides with a soft coating (e.g., Teflon).

A mask can be patterned with a predetermined pattern by known techniques (including, but not limited to, photo-etching and laser patterning) or unpatterned.

Examples of film materials from which a mask can be made include, without limitation, polyimide films such as, for example, and without limitation, 6FDA-ODA Fluorinated Polyimide, 6FDA-PMDA Fluorinated Co-Polyimide, 6FXDA-6FDA Fluorinated Polyimide Foam, Amoco Ultradel 4212 HFDA-APBP Polyimide, Au/Cr/Polyimide Composite, BPDA-ODA Polyimide, BPDA-PDA Polyimide Film, BPDA-PFMB Polyimide, BTDA-APB Polyimide, BTDA-ODA Polyimide, BTDA-PDA Polyimide, Ciba-Geigy Probimide 348 PMDA-ODA Polyimide, Ciba-Geigy Probimide 412 PSPI, Ciba-Geigy Probimide 414 PSPI, Ciba-Geigy XU-287 Soluble Polyimide, Cu/Cr/BPDA-PDA Polyimide Composite, Cu/Cr/PMDA-ODA Polyimide Composite, DuPont 5810D BPDA-PDA Polyimide, DuPont 5879HP PMDA-ODA Polyimide, DuPont FPI-136M Fluorinated Polyimide, DuPont FPI-45M Fluorinated Polyimide, DuPont Kapton 100 HN Polyimide Film, DuPont Kapton 300H Polyimide Film, DuPont Kapton 500HN Polyimide Film, DuPont Kapton Type H Polyimide Film, DuPont Kapton Type HN Polyimide Film, DuPont PI-2540 PMDA-4,4'-ODA Polyimide, DuPont PI-2545 PMDA-ODA Polyimide, DuPont PI-2556 BTDA-ODA-MPD Polyimide, DuPont PI-2560 BTDA-MPD-ODA Polyimide, DuPont PI-5878 PMDA-ODA Polyimide, DuPont Pyralin PI-2611 BPDA-PDA Polyimide, DuPont Pyralux Polyimide, GE Ultem Polyetherimide, Hitachi PIQ L100 Polyimide, Hitachi PIX L110 Polyimide, Mitsui Toatsu Aurum 450C Thermoplastic Polyimide, OMM Probimide 112A, OMM Probimide 114A, OMM Probimide 115A, OMM Probimide 116A, OMM Probimide 7005, OMM Probimide 7010, OMM Probimide 7020, OMM Probimide 7505 PSPI, OMM Probimide 7510 PSPI, OMM Probimide 7520 PSPI, PMDA-3,4'-ODA Polyimide, PMDA-3FDA Fluorinated Polyimide, PMDA-3FDA Fluorinated Polyimide Foam, PMDA-ODA Polyimide, PMDA-ODA m-diethylester, PMDA-PDA Polyimide Film, Probimide 32 Polyamide-imide, SE45 Siloxane—Polyimide, Upilex R Polyimide Film, and Upilex S Polyimide Film.

A non-limiting example of a mask comprises 001"±0.00015" THICK KAPTON HN includes slots with predetermined dimensions. For example, one embodiment of predetermined dimensions that can be used for printing a Red-Blue-Green subpixel arrangement for a display, can include line apertures or slots are 400 or 450 microns wide on a 1500 micron pitch.

Optionally, a mask can further include a hole in each of the four corners to mount and tension a mask to a rigid frame, which is preferred with thin masks, as discussed above. Various known techniques can be used to align a series of masks to be used to print and register multiple nanomaterials on a single substrate.

In certain embodiments, the mask can be placed against the substrate without gaps in between the substrate and the underside of the mask.

In other embodiments described herein, a mask can similarly be positioned on a transfer surface prior to applying nanomaterial thereto from a donor surface and/or on a substrate prior to contacting nanomaterial thereto from an applicator.

In another aspect of the invention there is provided a method of depositing nanomaterial onto a substrate. The method comprises applying a composition comprising nanomaterial to a donor surface, transferring at least a portion of the composition disposed on the donor surface to a transfer surface, and depositing at least a portion of the composition disposed on the transfer surface onto the substrate.

In another aspect of the invention there is provided a method of depositing nanomaterial onto a substrate. The method comprises applying a composition comprising nanomaterial and liquid to a donor surface; removing liquid from the composition disposed on the donor surface before transferring at least a portion of the substantially liquid-free composition to a transfer surface; and depositing at least a portion of the substantially liquid-free composition disposed on the transfer surface onto the substrate.

In another aspect of the invention there is provided a method of depositing nanomaterial onto a substrate. The method comprises applying a composition comprising nanomaterial and liquid to a donor surface; transferring at least a portion of the composition disposed on the donor surface to a transfer surface; and removing liquid from the composition disposed on the transfer surface before depositing at least a portion of the substantially liquid-free composition from the transfer surface onto the substrate.

In another aspect of the invention there is provided a method for depositing nanomaterial to a substrate. The method comprises: providing a substrate; providing a film including a layer comprising nanomaterial disposed on a side thereof, contacting the layer comprising nanomaterial to the substrate under conditions to cause the layer comprising nanomaterial to deposit onto the substrate. Known techniques can be used to transfer the layer comprising nanomaterial from the donor surface to the substrate. Examples include, but are not limited to, application of pressure, laser writing, laser ablation, thermal transfer, and other techniques identifiable by a person of ordinary skill in the relevant art.

In certain embodiments, as described above, a mask can be positioned on the substrate prior to contacting the layer comprising nanomaterial to the substrate.

In another aspect of the invention there is provided a method for depositing nanomaterial to a substrate. The method comprises: providing a substrate; providing a film including a layer comprising nanomaterial disposed on a side thereof, contacting the layer comprising nanomaterial to a transfer surface under conditions to cause the layer comprising nanomaterial to deposit on the transfer surface; removing at least a portion of the nanomaterial disposed on the transfer surface, and depositing nanomaterial onto the substrate.

In a detailed aspect, the method can optionally further include removing the film from the layer of nanomaterial deposited on the surface.

In the various aspects of the invention including a transfer surface, the nanomaterial can be selectively removed from the transfer surface in a predetermined pattern to be deposited onto the substrate.

In certain embodiments, for example, the nanomaterial can be removed from the transfer surface in a predetermined pattern by a patterned applicator (e.g., stamp, roller, etc.) with features (elevations and/or depressions) on the applicator surface corresponding to the predetermined pattern. In certain embodiments, a first pattern of material can be removed by a first applicator and the subtractive pattern of nanomaterial disposed on the transfer surface can be picked up by a second applicator and deposited onto the substrate.

In certain embodiments, for example, a predetermined pattern can be deposited onto the substrate by including features (elevations and/or depressions) corresponding to the predetermined pattern on all or a portion of the transfer surface. The nanomaterial disposed on the elevated features of the transfer surface can be picked up with an applicator in the predetermined pattern and deposited on the substrate.

In certain embodiments, for example, a predetermined pattern can be formed on the transfer surface by placing a mask including apertures corresponding to the predetermined pattern on the transfer surface before the nanomaterial is deposited. The nanomaterial will be deposited on the transfer surface through the apertures arranged in the determined pattern. After the mask is removed, the patterned nanomaterial deposited onto transfer surface through the apertures can be picked up by an applicator, preferably with an unfeatured surface, and deposited onto the substrate.

In certain embodiments, two or more patterns of different nanomaterials can be separately deposited onto the transfer surface to provide a predetermined pattern. As discussed above, the pattern of each nanomaterial is separately deposited and can be aligned by known techniques.

Embodiments of the invention including deposition predetermined patterns of two or more nanomaterials is useful for depositing two or more nanomaterials comprising semiconductor nanocrystals for example, in making light-emitting devices, displays, non-volatile memory devices, and other applications including two or more nanomaterials including semiconductor nanocrystals in a predetermined pattern.

As discussed above, the surface of the applicator can further be surface modified to enhance the attachment and release of nanomaterial from the surface.

In other embodiments, the nanomaterial is removed form the transfer surface as unpatterned layer to be deposited on the substrate.

In certain embodiments of the invention, a layer including a composition is applied to a donor surface by a micro-gravure roll. In such embodiments, the composition typically includes nanomaterial and liquid.

The composition applied to a donor surface from a conventional micro-gravure roll is applied as a coating which is unpatterned. However, a conventional micro-gravure roll can be modified to allow the composition to be applied to the donor surface in a patterned arrangement.

Examples of micro-gravure rolls and coating systems that can be used in the method of the invention include those available from Yasui Seiki Co., (USA), 601 S. Liberty Drive, Bloomington, Ind. 47403 or its parent company, Labo Company, Ltd. under the Micro Gravure trademark. For additional information and descriptions of micro-gravure rolls, coating systems, and methods, see U.S. Pat. Nos. 4,791,881; 4,844,002; 4,948,635; 5,266,144; and D328,943; D346,397; and D355,699, each of which is incorporated herein by reference in its entirety.

Examples of a donor surface include any sheet, film, tape, web material, etc. having two major planar opposing sides, which can be printed upon. A donor surface can include, for example, a sheet of material, a roll of material, etc. A donor surface can have different dimensions.

Preferably, the donor surface comprises a flexible material.

In certain embodiments, a donor surface includes Kapton 200E, Kapton 300H, Kapton 500H, other Kapton materials, PET, TEONEX, silicone treated PET, etc. Other examples include, but are not limited to, plastic, foil (including, but not limited to, metal foil), paper, nylon, cloth, the materials listed herein as examples of mask materials, cellulose based products, fabrics, plastics, including, for example, but not limited to, ABS, acetates, butyrates, phenolics, polycarbonates, polyesters, polyethylenes, polypropylenes, polystyrenes, polyurethanes and polyvinyl chlorides as monomers, copolymers and/or laminates. Other suitable materials and suppliers of such materials are available to those of ordinary skill in the art through various sources.

In certain embodiments, the selection of the donor surface can depend upon the equipment being used in carrying out the method. For example, the materials that can be used with micro-gravure tools available from Yasui Seiki Co. typically can have a thickness, from 1.6 micron to 175 micron. Equipment from other vendors may be useful with donor surfaces having the same or different thicknesses.

The dimensions of any sheet, film, tape, web materials, etc. are preferably selected corresponding to the size of the substrate or printing area onto which nanomaterial is to be deposited.

In certain embodiments, the donor surface can be individual sheets of a predetermined size and thickness. In certain other embodiments, the donor surface can be in the form of a continuous roll, having a predetermined width and thickness.

In certain embodiments, the donor surface can be treated (e.g., by application of one or more coatings, is otherwise surface modified (e.g., chemical modification of the surface, etc.). For example, a surface chemistry layer is disposed on the donor surface. A surface chemistry layer can be applied by physical vapor deposition (PVD), chemical vapor deposition (CVD), or liquid or gas phase coating by a self-assembled monolayer, depending on the desired material surface properties. In certain embodiments, the donor surface can be treated (e.g., by application of one or more coatings, is otherwise surface modified (e.g., chemical modification of the surface, etc.).

In certain embodiments, a donor surface can be treated (e.g., by application of one or more coatings) or otherwise surface modified (e.g., chemical modification of the surface, energetic treatments (including, but not limited to, plasma treatment, laser treatment, etc.), or other suitable surface-modification techniques) prior to application of nanomaterial thereto.

Examples of various surface treatments that can be applied to the donor surface include trichlorosilanes, other silylation treatments, teflon, etc. Selection of other surface treatments can be readily made by those of ordinary skill in the relevant art. In certain embodiments, silanized donor surfaces can be preferred.

Use of a micro-gravure roll to apply composition to the donor surface can provide a thin coating of compositions over a wide range of viscosities, especially with low viscosity liquids, including, for example, those listed in Table 1, above. A micro-gravure roll can have a diameter from 20 mm to 50 mm, determined by the coating width required. For example, micro-gravure rolls are 20 mm diameter for 300 mm width and increase to 50 mm diameter for coating widths of 1600 mm. See http://www.yasui.com/MicroGravure.htm#WHAT%201S%20THE%20Micro%20Gravure™%20METHOD.

Wet coatings with thicknesses in the range of from about 0.8 to about 22 microns can be applied to a donor surface from a micro-gravure roll depending on the mesh lines/inch of the engraved portion of the roll. For example, a wet coating with a thickness of about 0.8 micron can be applied with a micro-gravure roll with an engraved portion having 250 mesh lines/inch and a wet coating with a thickness of about 22 microns can be applied with a micro-gravure roll with an engraved portion having 85 mesh lines/inch.

In certain embodiment of the invention, a composition including a nanomaterial (e.g., semiconductor nanocrystals and a non-polar liquid (e.g., chloroform, toluene, or a mixture of hexane and octane) is applied to a donor surface (e.g., the underside of a traveling continuous web) from the engraved portion of a micro-gravure roll.

In a micro-gravure coating system, such as those available from Yasui Seiki Co., a doctor blade wipes out excessive composition applied to the engraved portion immediately before the engraved portion applies the composition onto the undersurface of the web donor surface.

Preferably, when a composition including nanomaterial and volatile liquid is used, the composition is contained and dispensed in a manner to minimize evaporation of liquid, which could change the concentration of the nanomaterial in the composition. For example, when used with a micro-gravure coating system, the supply of the composition to the roll could include a recirculation loop to allow for controlled liquid addition to maintain the concentration of the composition at a constant value and to accommodate replenishment of the composition on a continuous basis. The recirculation loop should preferably include on-line monitoring means (e.g., spectrometric) to ensure controlled concentration of nanomaterial in the composition.

Control of the concentration of the composition and the ratio of the roll speeds in a micro-gravure coating system can influence the ultimate wet thickness of the layer of composition applied to the donor surface. For example, the smoothness of the coating of composition applied to the donor surface can be adjusted by varying the relative velocity difference between the web donor surface and the gravure roll. In addition, the viscosity of the composition and the direction of the roll rotation relative to the movement direction of the donor surface can affect smoothness of the coating of composition applied to the donor surface from the gravure roll.

The rotational speed of the gravure roll can be varied so that the relative velocity between the web donor surface and the gravure roll is adjusted suitably to control the smoothness of the coating applied to the undersurface of the web and to adjust the thickness of the coating of composition applied to the gravure roll.

As discussed above, in various embodiments of the invention which include a composition including nanomaterial and liquid, the liquid can be removed from the composition before transfer or removal from the donor surface.

Alternatively, if a composition includes liquid, the liquid can be removed from the composition after the composition is applied to the applicator surface. This allows the nanomaterial and any optional non-liquid components of a composition to be deposited onto the substrate by a dry (e.g., liquid-free or substantially liquid-free) transfer. A method including a dry transfer of nanomaterials onto the substrate can be advantageous when liquid included in a composition can dissolve or otherwise react with the substrate.

In embodiments including a transfer surface, liquid can be removed from the composition before deposited onto the transfer surface, after being deposited onto the transfer surface. Alternatively, the liquid is removed after the composition is removed from the transfer surface, e.g., on the applicator surface or after the composition is deposited onto the substrate.

A dry transfer process is preferred, for example, when transferring a composition including semiconductor nanocrystals onto an organic layer of a light-emitting device structure during device fabrication.

If interaction between the substrate and the liquid is not a concern, the composition can be deposited onto the substrate without prior removal the liquid therefrom. The liquid can be removed after deposition of the composition(s) onto the substrate.

If a wet transfer is desired, and the liquid is appreciably volatile at ambient conditions, the time between application of composition(s) to the applicator surface and deposition thereof onto the substrate is controlled to allow the deposition to occur while the composition(s) includes at least an amount of liquid.

In certain embodiments, the composition (whether including or not including liquid) can be selectively removed from the donor sheet, the transfer sheet, and/or the substrate with an applicator. A stamp comprising an elastomer material is particularly advantageous for depositing nanomaterial comprising, e.g., semiconductor nanocrystals, to a surface. The range of properties of various elastomer materials facilitates selection of an applicator having a predetermined hardness (durometer) which affects the force that can be applied as well as the compression of the stamp.

In certain embodiments, the applicator can have a surface that is featureless or smooth (e.g. without patterned depressions and elevations). A featureless applicator surface can be planar or contoured (e.g., convex, pyramidal, conical, etc.). In certain embodiments, the applicator surface can include features formed by elevations and depressions on the surface, e.g., a pattern of elevations and depressions. The featured applicator surface can further be planar or contoured (e.g., convex, pyramidal, conical, etc.)

A contoured applicator can be useful for providing higher fidelity printing and reduction of trapped gas (i.e. air, nitrogen) bubbles between the receiving surface and the applicator during the deposition of the patterned nanomaterial.

Examples of an applicator can include, without limitation, a surface of a stamp, a roller, etc. Preferably, the applicator has a predetermined dimension so that a pattern can be formed by one time transfer, even, for example, in case of a display device having a large area by using an applicator corresponding to a selected area of the display device.

In certain embodiments, the method can include a donor surface, transfer surface and/or applicator having a modified surface. Modifying a surface of the donor surface, transfer surface and/or the applicator can include, e.g., applying one or more coatings to the surface to modify the properties (e.g., chemical, surface energy, other energetic treatments (including, but not limited to, plasma treatment, laser treatment, etc.), or by other suitable surface-modification techniques) thereof prior to application of nanomaterial thereto. Selection of other surface modification treatments can be readily made by those of ordinary skill in the relevant art. In certain embodiments, silanized donor surfaces can be preferred.

For example, a surface chemistry layer can be applied by physical vapor deposition (PVD), chemical vapor deposition (CVD), or liquid or gas phase coating by a self-assembled monolayer, depending on the desired material surface properties. The composition of the surface chemistry layer is selected to readily adhere and release the composition, in a wet transfer, or nanomaterial, in a dry transfer. The surface chemistry layer can optionally act as a barrier to stamp swelling by the carrier medium for the nanomaterial of the composition, and an adhesion/surface chemistry layer for the composition or nanomaterial. Aromatic organic polymers, deposited by chemical vapor deposition, can be used as a surface chemistry layer. See, for example, S. Coe-Sullivan, et al., Advanced Functional Materials, 15, 1117-1124 (2005), which is incorporated by reference in its entirety. Application of the surface chemistry layer by chemical vapor deposition can result in a conformal coating of the shaped stamp. The surface chemistry layer can be chosen to be compatible with spreading of the composition which includes nanomaterial and liquid. For example, with liquid comprising chloroform, the surface chemistry layer can be a chemical vapor deposited Parylene-C layer. The Parylene-C layer can be, for example, 0.1 to 2 µm thick, depending on the pattern to be reproduced.

Including a surface chemistry layer comprising Parylene-C on the surface of an applicator advantageously enables complete release of the nanomaterial from the surface thereof. Parylene-C further is compatible with a wide range of liquids (e.g., non-polar organic liquids). Parylene-C is an aromatic polymer that can form thin and conformal coatings exhibiting highly inert properties.

The above properties of Parylene-C make it a preferred surface chemistry layer for use in depositing nanomaterials comprising semiconductor nanocrystals, particularly when deposited in thin layers including same.

Removal of composition disposed on the donor surface after removal of the liquid can improve the efficiency of transfer by avoiding possible spreading or wetting of the composition on the applicator surface due to the presence of liquid.

As discussed above, in accordance with another aspect of the invention, a method of depositing nanomaterial onto a substrate includes applying a composition comprising nanomaterial to a donor surface, transferring at least a portion of the composition disposed on the donor surface to a transfer surface, and depositing at least a portion of the composition from the transfer surface onto the substrate.

As discussed above, in certain embodiments, the composition includes nanomaterial and liquid.

When liquid is further included in the composition, the liquid can optionally be removed before transfer of the composition disposed on the donor surface or after transfer to the transfer surface, but before deposition of the liquid-free or substantially liquid-free composition onto the substrate.

In certain embodiments, removal of liquid is minimized during transfer of at least a portion of the composition disposed on the donor surface to the transfer surface and in a subsequent deposition onto a substrate.

The transfer surface can be a planar surface. In certain embodiment, the embodiment can be rigid. In certain embodiments, the transfer surface can be flexible. The transfer surface can be glass, plastic, metal, etc. Preferably the surface of the transfer surface is be treated (e.g., by application of one or more coatings, is otherwise surface modified (e.g., chemical modification of the surface, surface energy modification etc.). For example, a surface chemistry layer is disposed on the transfer surface. A surface chemistry layer can be applied by physical vapor deposition (PVD), chemical vapor deposition (CVD), or liquid or gas phase coating by a self-assembled monolayer, depending on the desired material surface properties. In certain embodiments, the donor surface can be treated (e.g., by application of one or more coatings, is otherwise surface modified (e.g., chemical modification of the surface, etc.). Examples of surface chemistry treatments that can be used for transfer surfaces include those listed above in the discussion of surface modifications of applicator surfaces.

In embodiments of the invention which include transfer of composition (with or without liquid) to a transfer surface, the transfer surface is preferably in close proximity to the donor surface.

In certain embodiments, at least a portion of the composition is disposed on the transfer surface can be applied to the transfer surface or substrate by contacting the donor surface including the composition (whether including or not including liquid) with adequate pressure to transfer the composition thereto.

In certain embodiments, at least a portion of the composition (whether including or not including liquid) is transferred from the transfer surface onto an applicator and thereafter deposited onto the substrate.

The applicator can have a surface that is featureless or smooth (e.g. without patterned depressions and elevations). A featureless applicator surface can be planar or contoured (e.g., convex, pyramidal, conical, etc.). In certain embodiments, the applicator surface can include features formed by elevations and depressions on the surface, e.g., a pattern of elevations and depressions. The featured applicator surface can further be planar or contoured (e.g., convex, pyramidal, conical, etc.)

A contoured applicator can be useful for providing higher fidelity printing and reduction of trapped gas (i.e. air, nitrogen) bubbles between the receiving surface and the applicator during the deposition of the patterned nanomaterial.

Examples of an applicator can include, without limitation, a surface of a stamp, a roller, etc. Preferably, the applicator has a predetermined dimension so that a pattern can be formed by one time transfer, even, for example, in case of a display device having a large area by using an applicator corresponding to a selected area of the display device.

In certain embodiments, the surface of the applicator can be surface treated, as discussed above.

With use of a micro-gravure coating system, a plurality of webs can be transported through the device and coating of different compositions comprising different nanomaterials can be supplied for respective webs so that respective webs are coated with the coating agents of different compositions, e.g., compositions including semiconductor nanocrystals tuned to emit photons of different wavelengths.

For example, compositions including blue, red and green emitting semiconductor nanocrystals are fed to three gravure coating devices and the gravure coating devices are maintained at their lowered positions until a portion of the undersurface of the web which must be coated with the coating of a specific color passes the gravure coating devices. When said portion of the web enters one of the gravure coating devices having a specific color coating, the gravure coating device is raised so that the engraved portion of the gravure roll applied with the coating having said specific color is made into contact with the undersurface of the web. In this way, the different compositions can be disposed on predetermined portions of the undersurface of the web.

In certain embodiments, a composition including nanomaterial and liquid is deposited on a cylindrical applicator, dried, and subsequently transferred from the cylindrical applicator to the display substrate. If multiple nanomaterials are deposited onto the substrate, each composition is preferably separately applied to the applicator and deposited onto the substrate, with each deposition step being preceded by a transfer of the composition to the applicator. As discussed above, the composition can be applied to the applicator from a donor surface or from a transfer surface. When depositing each of the different nanomaterials onto the substrate, each deposition can be aligned and registered by known techniques to prevent overlap or distortion of the predetermined arrangement of nanomaterials that is desired.

The methods or the invention are compatible with various well-known alignment and registration techniques for example, when more than one pattern is transferred to the receiving surface in more than one transfer. Factors that can affect the registration of subsequent printing steps onto a single substrate include multiple well pattern (e.g., groove) offset, as well as the travel distance from one nanomaterial deposition to the next. Since both of these parameters can be tuned on the micron scale, high repeatability after tuning is expected.

In one aspect of the invention there is provided an article of manufacture comprising nanomaterial disposed on a backing member. In certain embodiments, the backing member comprises a film. In certain embodiments, the article can further include a removable protective sheet disposed over the surface of the nanomaterial opposite the backing member.

In another aspect of the invention there is provided an article of manufacture comprising nanomaterial reversibly attached to a backing member. In certain embodiments, the backing member comprises a film. In certain embodiments, the article can further include a removable protective sheet disposed over the surface of the nanomaterial opposite the backing member.

In another aspect of the invention there is provided an article of manufacture comprising nanomaterial disposed on a removable backing member. In certain embodiments, the backing member comprises a film. In certain embodiments, the article can further include a removable protective sheet disposed over the surface of the nanomaterial opposite the backing member.

In another aspect of the invention there is provided a method of depositing a layer comprising nanomaterial onto a donor surface. The method comprises applying a coating including a composition comprising nanomaterial to a donor surface.

In certain embodiments, the donor surface includes a surface modification such that the nanomaterial is reversibly attached to the donor surface. Examples of surface modifications include, without limitation, those discussed above as surface modifications that can be optionally included on a donor surface, transfer surface, and/or applicator. In one embodiment a coating of Parylene-C can be included on the surface of the donor surface. In another embodiment, the surface of the donor surface can be silanized.

In another detailed aspect of the invention, the donor surface comprises a film. A film can comprise a sheet, a tape, a web, etc. Examples of film materials include, e.g., PET, Kapton, plastic, foil, paper, nylon, cloth, etc. Other examples of films are provided herein. A film can be flexible or rigid. In some embodiments, a flexible film is preferred. A film can optionally include other layers (patterned or unpatterned) and/or other features thereon.

In another aspect of the invention there is provided a method for making a device. The method comprises: providing a substrate; providing a film including a layer comprising nanomaterial disposed on a side thereof, contacting the layer comprising nanomaterial to a surface of the substrate. In a detailed aspect, the layer comprising nanomaterial is contacted to the surface of the substrate under conditions to cause the layer comprising nanomaterial to deposit on the substrate. In a detailed aspect, the method can optionally further include removing the film from the layer of nanomaterial deposited on the surface.

In a certain embodiments, method for making a device comprises providing a substrate that may optionally further include an electrode, a charge transport layer, and/or additional layers or features; providing a film including a layer comprising semiconductor nanocrystals disposed on one side thereof, contacting the layer comprising semiconductor nanocrystals to a surface of the substrate under conditions effect to cause the layer comprising semiconductor nanocrystals to deposit onto the surface of the substrate. In certain embodiments, the semiconductor nanocrystals are reversibly attached to the film, and the film is optionally removed. Optionally, additional layers (e.g., charge transport layer, charge blocking layer, electrode, other electrical features, etc.) may be disposed over the layer including semiconductor nanocrystals. The semiconductor nanocrystals may be light-emitting or light absorbing. The optional additional layers and/or features of the device are selected depending upon the type of device being made. For instance, embodiments of this method can be useful to make light-emitting devices, displays, photodetectors, hyperspectral imaging devices.

A detailed example of one embodiment of a device structure (from bottom to top) can include a 150 nm indium tin oxide (ITO) anode layer, a 70 nm Poly(3,4-ethylenedioxythiophene)poly(styrenesulfonate) (PEDOT:PSS) hole injection layer (HIL), a 50 nm N,N'-Bis(3-methylphenyl)-N,N'-bis-(phenyl)-spiro (spiro-TPD) hole transport layer, a 5-10 nm semiconductor nanocrystals emissive layer, a 50 nm 2,2', 2"-(1,3,5-benzinetriyl)-tris(1-phenyl-1-H-benzimidazole) (TPBi) hole-blocking/electron transporting layer and a 0.5 nm LiF/100 nm Al cathode layer. The ITO layer can be deposited, patterned and cleaned using industry standard techniques. The PEDOT:PSS layer can be deposited by spin coating followed by bake out at 125 C for 20 minutes. All other organic and metal layers can be thermally evaporated in a high vacuum chamber. Prior to testing and operation the entire device is preferably encapsulated using, for example, a sealant in a dry nitrogen environment (<1 ppm $O_2$, <1 ppm $H_2O$). A sealant of the type used in OLEDs is one example of a sealant that can be used.

Examples of semiconductor nanocrystals useful in the above described device include, for example, and without limitation, those described in U.S. Patent Application Nos. 60/825,373, filed 12 Sep. 2006 and 60/825,374m filed 12 Sep. 2006.

Examples of a photodetector including semiconductor nanocrystals are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety, In certain embodiments, the method can be useful to make a non-volatile memory device. An example of such type of device is described in U.S. patent application Ser. No. 10/958, 659, entitled "Non-Volatile Memory Device", of Bawendi et al., filed 6 Oct. 2004, the disclosure of which is hereby incorporated herein by reference in its entirety.

In some embodiments, the substrate can include a backplane. The backplane can include active or passive electronics for controlling or switching power to individual pixels. Include a backplane can be useful for applications such as displays, sensors, or imagers. In particular, the backplane can be configured as an active matrix, passive matrix, fixed format, directly drive, or hybrid. The display can be configured for still images, moving images, or lighting. A lighting display can provide white light, monochrome light, or color-tunable light. See, e.g., U.S. patent application Ser. No. 11/253,612, filed Oct. 21, 2005, the disclosure of which is hereby incorporated herein by reference in its entirety.

The method for making a device, or at least some of the steps thereof, can optionally be carried out in a controlled (oxygen-free and moisture-free) environment, preventing the quenching of luminescent efficiency during the fabrication process. Additional steps may optionally be further included in the method to make devices with multilayer structures (see, for example, U.S. patent application Ser. Nos. 10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene. In certain embodiments inorganic materials may be used to fabricate various of the above layers. See U.S. patent application Ser. No. 11/354,185, entitled, "Light Emitting Devices Including Semiconductor Nanocrystals", of Bawendi et al., filed 15 Feb. 2006, the disclosure of which is hereby incorporated herein by reference in its entirety.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Semiconductor nanocrystals can be included in efficient hybrid organic/inorganic light emitting devices.

As used herein, "top" and "bottom" are relative positional terms, based upon a location from a reference point. For example, "top" of a device structure means farthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to an emissive material includes reference to one or more of such materials.

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In various instances herein, a semiconductor nanocrystal is referred to by the term "nanocrystal".

It will be apparent to those skilled in the art that various modifications can be made in the methods, articles and systems of the present invention without departing from the spirit or scope of the invention. Thus, it is intended that the present invention cover modifications and variations of this invention provided they come within the scope of the appended claims and their equivalents.

All the patents and publications mentioned above and throughout are incorporated in their entirety by reference herein.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. An article of manufacture comprising a layer including a composition including two or more different nanomaterials comprising light-emissive semiconductor nanocrystals and a metal oxide sol-gel, the layer being disposed on a surface of a flexible backing member comprising a plastic film, wherein the semiconductor nanocrystals comprise a core including a first semiconductor material surrounded by a shell including a second semiconductor material, and a protective sheet disposed over the nanomaterials.

2. A flexible backing member comprising a plastic film including a layer including a composition including a carrier medium and two or more different nanomaterials comprising light-emissive semiconductor nanocrystals, the layer being disposed on a surface of the flexible backing member, and a protective sheet disposed over the layer, wherein the semiconductor nanocrystals comprise a core including a first semiconductor material surrounded by a shell including a second semiconductor material.

3. A flexible backing member comprising a plastic film, the backing member including a predetermined arrangement of a composition including a carrier medium and two or more different nanomaterials comprising light-emissive semiconductor nanocrystals comprising a core including a first semiconductor material surrounded by a shell including a second semiconductor material, the composition being reversibly attached to the backing member.

4. A flexible backing member comprising a plastic film including a composition including a carrier medium and two or more different nanomaterials comprising light-emissive semiconductor nanocrystals comprising a core including a first semiconductor material surrounded by a shell including a second semiconductor material, the composition being disposed on a surface of the backing member, the backing member being removable from the composition.

5. A flexible backing member in accordance with claim 2 wherein the layer is patterned.

6. A flexible backing member in accordance with claim 2 wherein the layer is unpatterned.

7. A flexible backing member in accordance with claim 2 wherein the film comprises a sheet of material.

8. A flexible backing member in accordance with claim 2 wherein the film comprises a roll of material.

9. A flexible backing member in accordance with claim 2 wherein the surface of the flexible backing member on which the layer is disposed is surface-modified.

10. A flexible backing member in accordance with claim 2 wherein the carrier medium comprises a polymer.

11. A flexible backing member in accordance with claim 2 wherein the carrier medium comprises a monomer.

12. A flexible backing member in accordance with claim 2 wherein the semiconductor nanocrystals are tuned to emit photons of different wavelengths.

13. A flexible backing member in accordance with claim 3 further comprising a protective sheet disposed over the nanomaterials.

14. A flexible backing member in accordance with claim 4 further comprising a protective sheet disposed over the nanomaterials.

* * * * *